(12) United States Patent
Chen et al.

(10) Patent No.: US 8,012,811 B2
(45) Date of Patent: *Sep. 6, 2011

(54) METHODS OF FORMING FEATURES IN INTEGRATED CIRCUITS

(75) Inventors: Kuan-Neng Chen, White Plains, NY (US); John Christopher Arnold, North Chatham, NY (US); Niranjana Ruiz, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 817 days.

This patent is subject to a terminal disclaimer.

(21) Appl. No.: 11/968,778

(22) Filed: Jan. 3, 2008

(65) Prior Publication Data

US 2009/0176062 A1  Jul. 9, 2009

(51) Int. Cl.
*H01L 21/82* (2006.01)

(52) U.S. Cl. ........ 438/129; 438/587; 438/596; 438/696; 257/E21.014; 257/E21.02; 257/E21.305

(58) Field of Classification Search .......... 438/599, 438/711; 257/E21.014, E21.017, E21.02, 257/E21.221, E21.222, E21.224, E21.305
See application file for complete search history.

(56) References Cited

U.S. PATENT DOCUMENTS

| | | | |
|---|---|---|---|
| 4,419,809 A | 12/1983 | Riseman et al. | |
| 4,705,597 A | 11/1987 | Gimpleson et al. | |
| 4,803,181 A | 2/1989 | Buchmann et al. | |
| 5,801,088 A | 9/1998 | Gardner et al. | |
| 6,124,174 A | 9/2000 | Gardner et al. | |
| 6,566,280 B1 | 5/2003 | Meagley et al. | |
| 7,112,508 B2 | 9/2006 | Rhodes et al. | |
| 2001/0006242 A1* | 7/2001 | Kwak et al. | 257/311 |
| 2005/0221513 A1 | 10/2005 | Yue et al. | |
| 2006/0063364 A1 | 3/2006 | Stephens et al. | |
| 2007/0134922 A1 | 6/2007 | Mori et al. | |
| 2007/0190713 A1 | 8/2007 | Doris et al. | |
| 2009/0176040 A1* | 7/2009 | Chen et al. | 428/34.1 |

* cited by examiner

*Primary Examiner* — Cheung Lee
(74) *Attorney, Agent, or Firm* — Vazken Alexanian; Ryan, Mason & Lewis, LLP

(57) ABSTRACT

A feature is formed in an integrated circuit by providing one or more layers to be patterned, providing a first layer overlying the one or more layers to be patterned, and providing a second layer overlying the first layer. The second layer is patterned to form a raised feature with one or more sidewalls. Subsequently, the first layer is processed such that components of the first layer deposit on the one or more sidewalls of the raised feature to form a mask. The mask is used to pattern the one or more layers to be patterned.

18 Claims, 8 Drawing Sheets

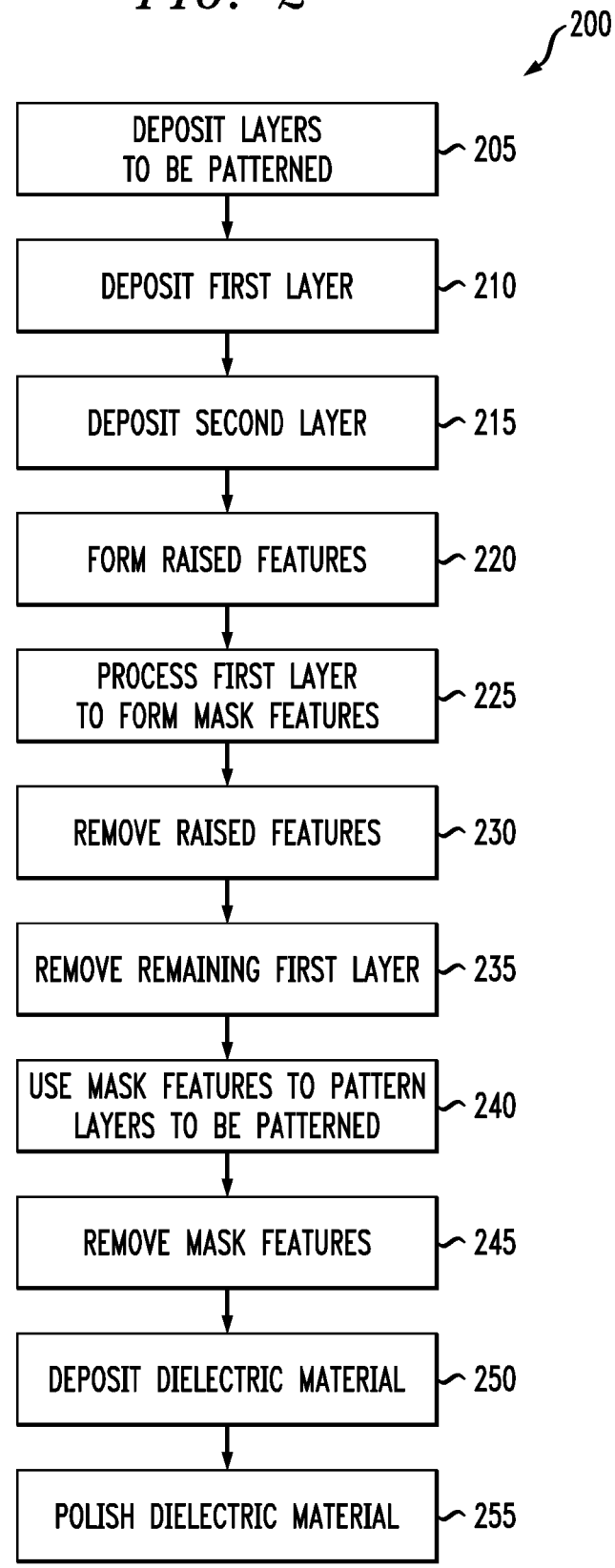

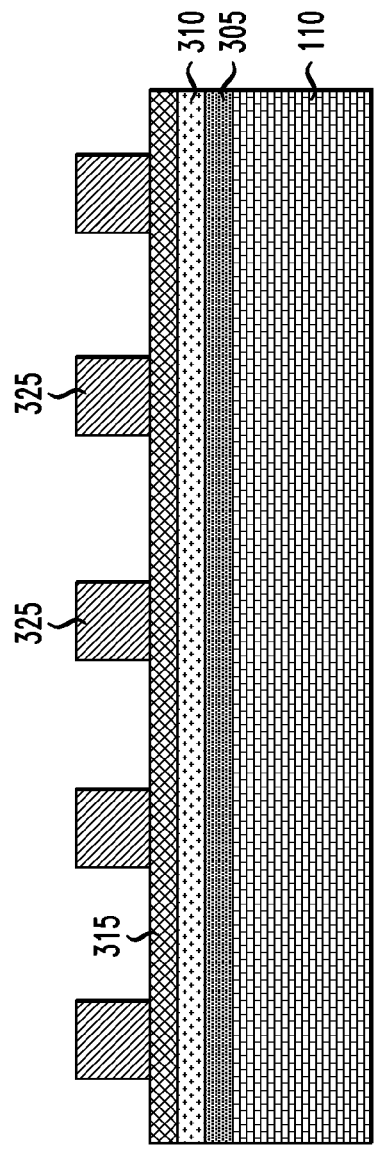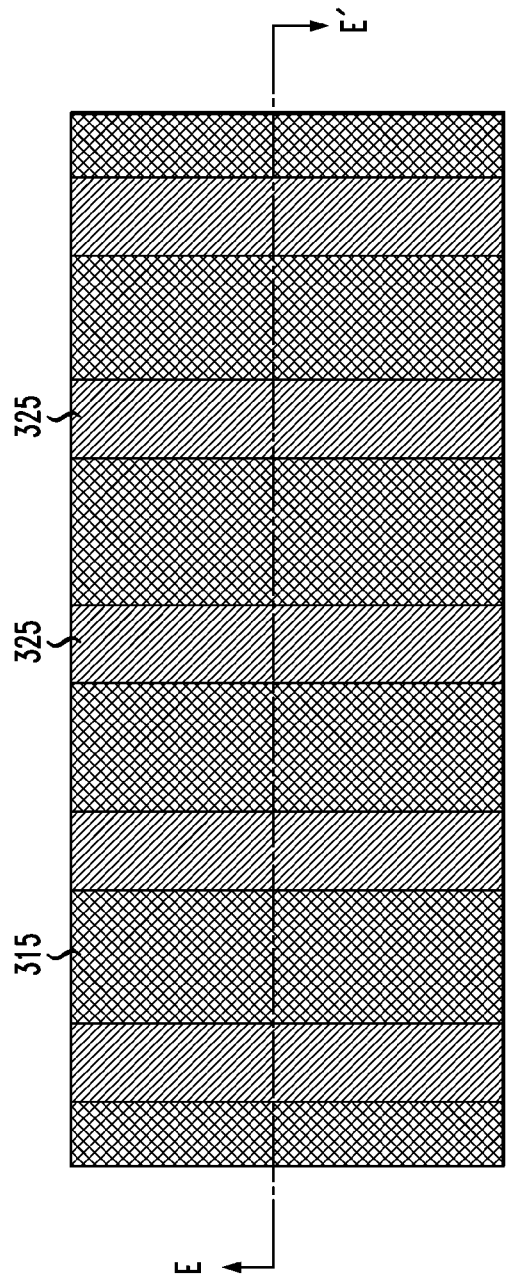

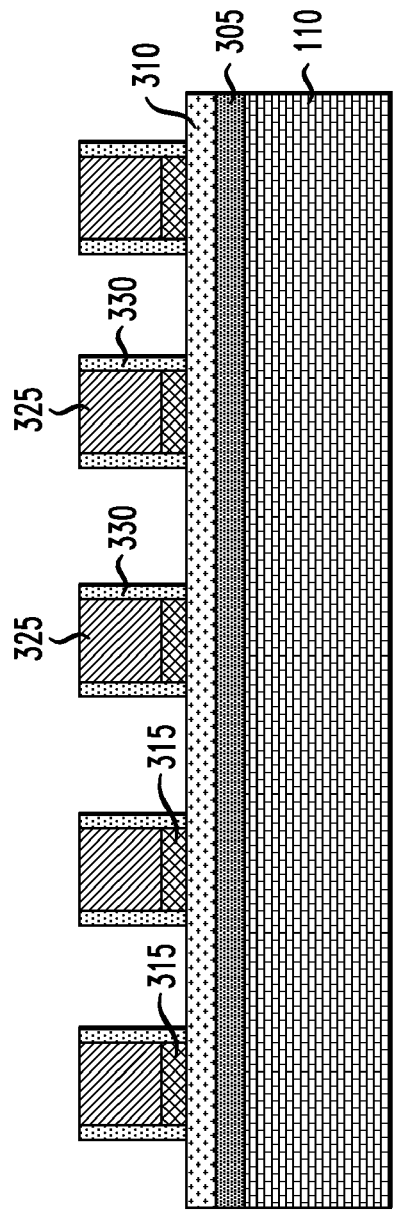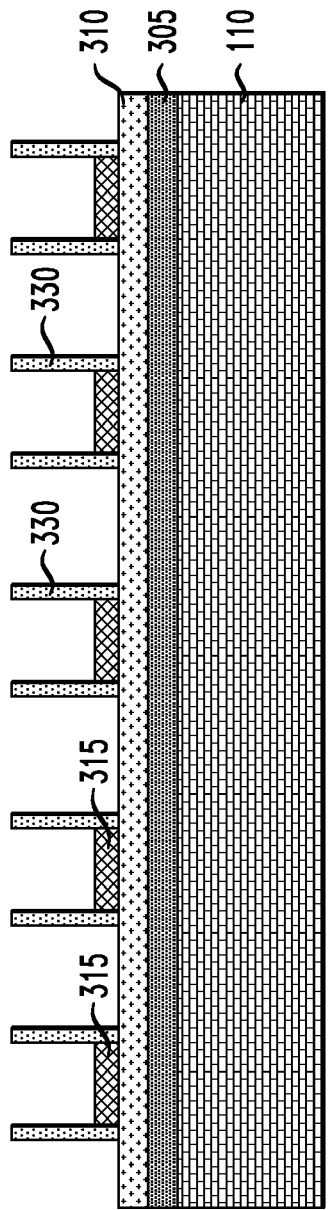

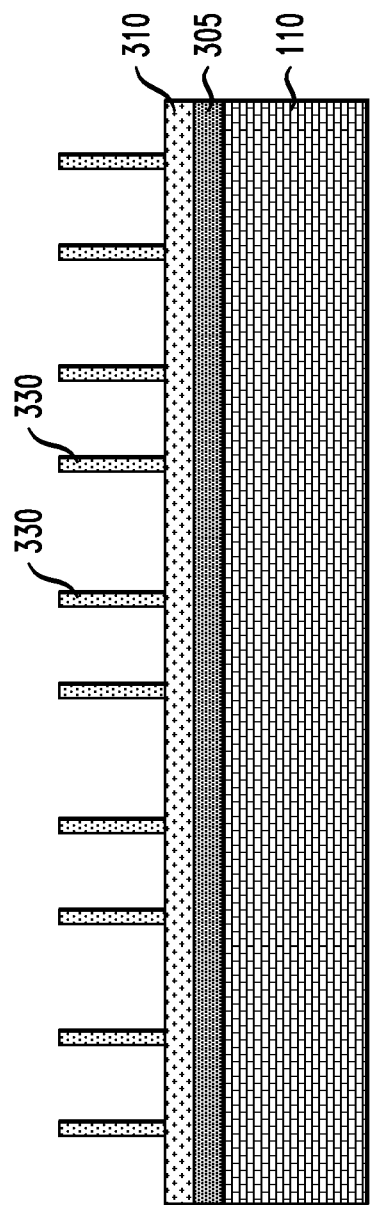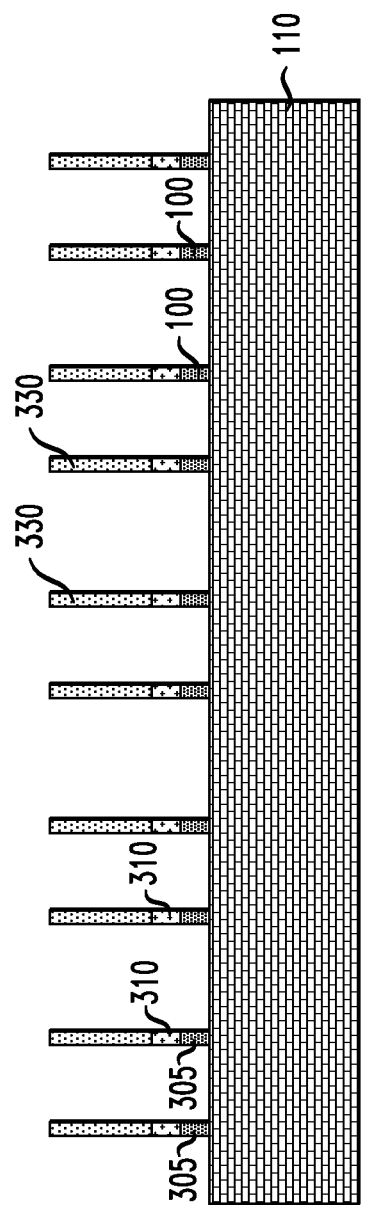

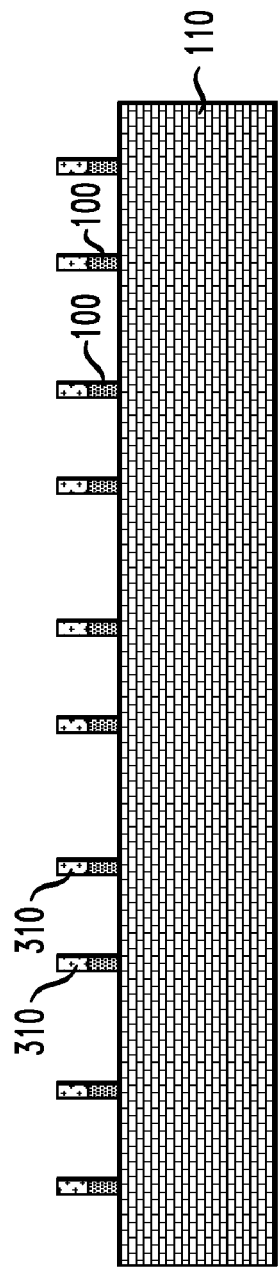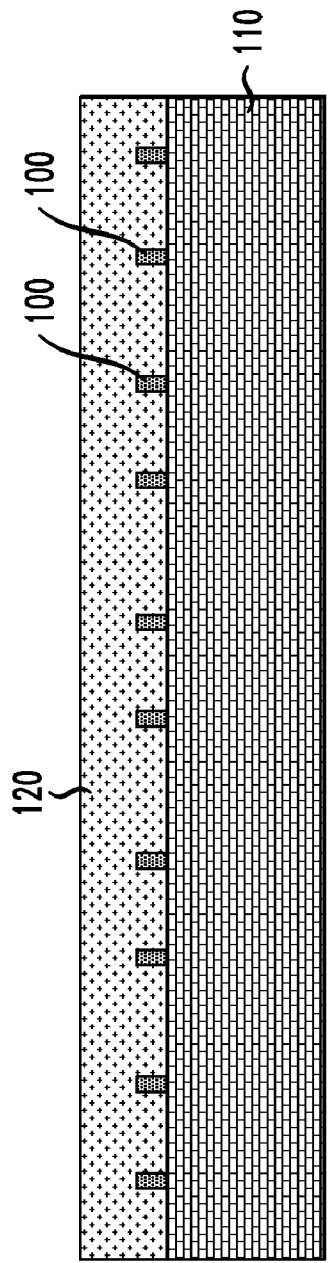

METHODS OF FORMING FEATURES IN INTEGRATED CIRCUITS

FIELD OF THE INVENTION

The present invention is directed generally to integrated circuits, and, more particularly, to methods of forming features such as gate conductors and metal interconnects in integrated circuits.

BACKGROUND OF THE INVENTION

Silicon-based complimentary metal-oxide-semiconductor (CMOS) technology entered the nanometer era around the year 2000 when the semiconductor industry began to produce integrated circuits in the 0.13 micrometer technology node. Within this node, the industry incorporated metal-oxide-semiconductor field effect transistors (MOSFETs) with gate lengths of about 70 nanometers. Since that time, gate lengths have continued to decrease. MOSFETs are expected to have gate lengths on the order of only ten nanometers some time before the year 2020.

The key driver behind these trends is economics. Smaller devices take up less space on an integrated circuit and are less expensive to manufacture. For example, the cost to produce a single MOSFET has decreased by seven orders of magnitude during the last 40 years in large part because of the reduction in their size. In addition, smaller devices typically consume less power and have higher performance when compared to larger devices.

One manner in which to produce nano-scale features (i.e., features with minimum lateral dimensions less than about 100 nanometers) on integrated circuits is to try to print them directly using lithography. Conventional optical lithography enhanced with high numerical apertures, retical enhancement techniques, and double exposures may, for example, pattern devices in the 22 nanometers technology node. Nevertheless, the lithographic tools and enhancements required to achieve these dimensions are typically complex and expensive. As a result, there remains a need for methods of precisely forming nano-scale features on integrated circuits that do not depend on directly printing the features using lithography.

SUMMARY OF THE INVENTION

Embodiments of the present invention address the above-identified need by providing methods of fabricating narrow features in integrated circuits without directly printing the features using lithography.

In accordance with an aspect of the invention, a feature is formed in an integrated circuit by providing one or more layers to be patterned, providing a first layer overlying the one or more layers to be patterned, and providing a second layer overlying the first layer. The second layer is patterned to form a raised feature with one or more sidewalls. Subsequently, the first layer is processed such that components of the first layer deposit on the one or more sidewalls of the raised feature to form a mask. The mask is used to pattern the one or more layers to be patterned.

In accordance with one of the above-identified embodiments of the invention, an array of gate conductors is formed by depositing a layer of tantalum silicon nitride ("TaSiN") on a dielectric etch stop layer and a layer of polysilicon. A layer of photoresist is then deposited on the layer of TaSiN. Subsequently, the layer of photoresist is patterned by optical lithography to form an array of raised features, each raised feature having one or more sidewalls. The layer of TaSiN is then exposed to an anisotropic etching process, causing components of the TaSiN to deposit on the sidewalls of the raised features. This creates mask features on the sidewalls of the raised features. Removing the raised features and the remaining portions of the first layer allow the silicon dioxide and polysilicon layers to be patterned using the mask features as etch masks. Gate conductors with widths less than about ten nanometers are readily fabricated in this manner.

These and other features and advantages of the present invention will become apparent from the following detailed description which is to be read in conjunction with the accompanying drawings.

BRIEF DESCRIPTION OF THE DRAWINGS

FIG. 2 shows a flow chart of a method in accordance with an illustrative embodiment of the invention for forming the gate conductors in FIGS. 1A and 1B.

FIGS. 3A-3L show sectional views and plan views of a film stack as it appears at various stages in the FIG. 2 method.

DETAILED DESCRIPTION OF THE INVENTION

This invention will be illustrated herein in conjunction with an exemplary method of forming features in integrated circuits. It should be understood, however, that the invention is not limited to the particular materials, feature shapes, processing steps, and applications shown and described herein. Modifications to the illustrative embodiments will be apparent to those skilled in the art.

Particularly with respect to processing steps, it is emphasized that the descriptions provided herein are not intended to encompass all of the processing steps which may be required to successfully form a functional device in an integrated circuit. Rather, certain processing steps which are conventionally used in forming integrated circuit devices, such as, for example, wet cleaning and annealing steps, are purposefully not described herein for economy of description. However one skilled in the art will readily recognize those processing steps omitted from this generalized description. Moreover, details of conventional semiconductor processing steps described herein will only be described generally since the details of these conventional processes will be known to one skilled in the art and since there are commercially available semiconductor processing tools for implementing these processing steps. Details of the processing steps used to fabricate semiconductor devices may be found in a number of publications, for example, S. Wolf and R. N. Tauber, *Silicon Processing for the VLSI Era, Volume* 1, Lattice Press, 1986; and S. Wolf, *Silicon Processing for the VLSI Era, Volume* 4: *Deep Submicron Process Technology*, Lattice Press, 2002, both of which are incorporated herein by reference.

It should also be understood that the various layers and/or regions shown in the accompanying figures may not be drawn to scale.

Methods in accordance with aspects of the invention are capable of forming a variety of patterned features for use in integrated circuits. These patterned features may include, but are not limited to, gate conductors and metal interconnects. Solely for illustrative purposes, aspects of the invention will initially be described by detailing an illustrative method embodiment directed at forming gate conductors for use with CMOS MOSFETs. Nevertheless, the choice of this particular application should not be construed as limiting the scope of the invention to any particular patterned feature type.

Figure 1A:
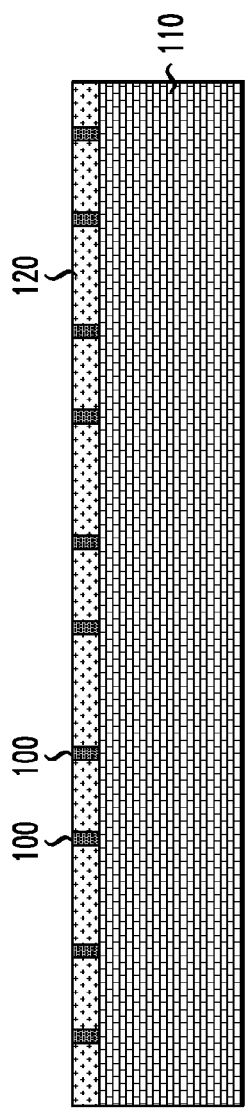
FIGS. 1A and 1B show a sectional view and a plan view, respectively, of an array of gate conductors capable of being formed by a method in accordance with aspects of the invention.
Figure 1B:
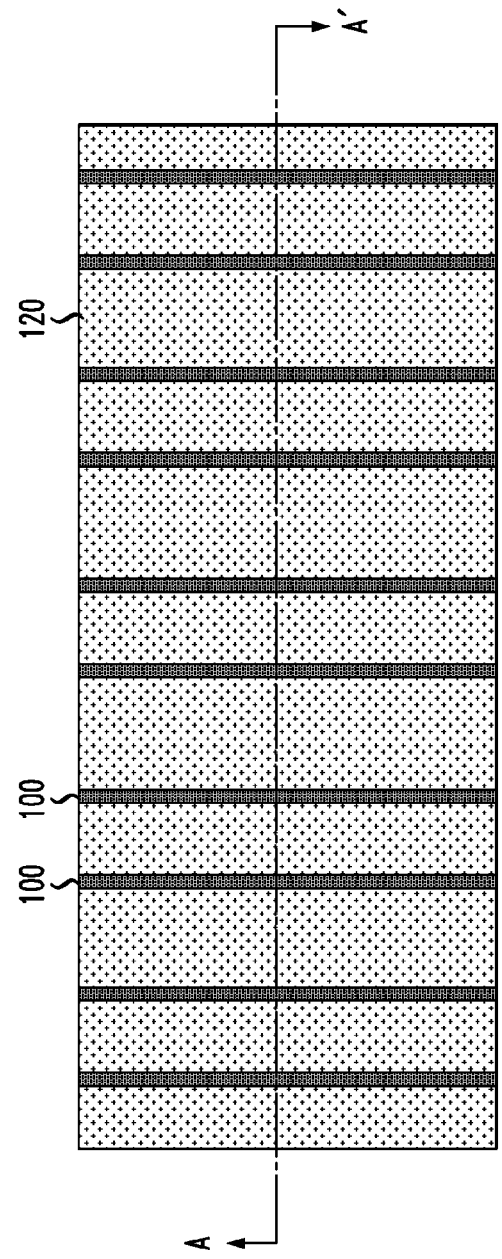

With respect to figures, FIGS. 1A and 1B show a sectional view and a plan view, respectively, of an array of gate conductors 100 capable of being formed by the above-described illustrative method embodiment. In particular, FIG. 1A is a cross-sectional view along line A-A' in FIG. 1B. FIG. 2, moreover, shows a flow chart of the method embodiment, here designated by reference numeral 200. Finally, FIGS. 3A-3L show a film stack as it appears at various stages in the FIG. 2 method.

It will be observed while referring to FIGS. 1A and 1B that the gate conductors 100 are formed on a substrate 110. The substrate may, for example, comprise silicon or another suitable semiconductor material (e.g., germanium or gallium arsenide), while the gate conductors may comprise doped polysilicon or another suitable conductive material (e.g., tungsten). A dielectric material 120 fills the spaces between the gate conductors, providing electrical isolation. This dielectric material may comprise silicon dioxide or some other appropriate insulating material (e.g., silicon nitride or silicon oxynitride).

While the gate conductors 100 describe parallel straight lines, they may in fact be fabricated with various shapes. When implemented in an integrated circuit, for example, it is contemplated that each of the gate conductors will service one or more MOSFETs in a manner that is tailored to the particular layout for the integrated circuit. As a result, in actual application, the lengths of the gate conductors and their paths will likely vary. Advantageously, features formed in accordance with aspects of this invention may easily achieve widths (i.e., the minimum dimension in a plane parallel to the uppermost surface of the substrate 110) less than about ten nanometers. Accordingly, gate conductors like those shown in the FIGS. 1A and 1B are capable of being used to produce MOSFETs with extremely short gate lengths.

The illustrative process for forming the gate conductors 100 and their associated film stack begins with step 205 in the method 200 where one or more layers to be patterned are sequentially deposited on the substrate 110. In the present embodiment, there are two layers to be patterned. A layer of gate material 305 that will ultimately become the gate conductors 100 is initially deposited on the substrate, resulting in the film stack shown in FIG. 3A. Subsequently, an etch stop layer 310 is deposited on the layer of gate material. These steps result in the film stack shown in FIG. 3B.

If the layer of gate material comprises polysilicon, it may be deposited by conventional chemical vapor deposition (CVD) techniques. The etch stop layer 310 will later serve to stop an anisotropic etch process. As a result, the etch stop layer preferably comprises silicon dioxide or another suitable dielectric material. It too may be deposited by CVD.

Figure 3A:
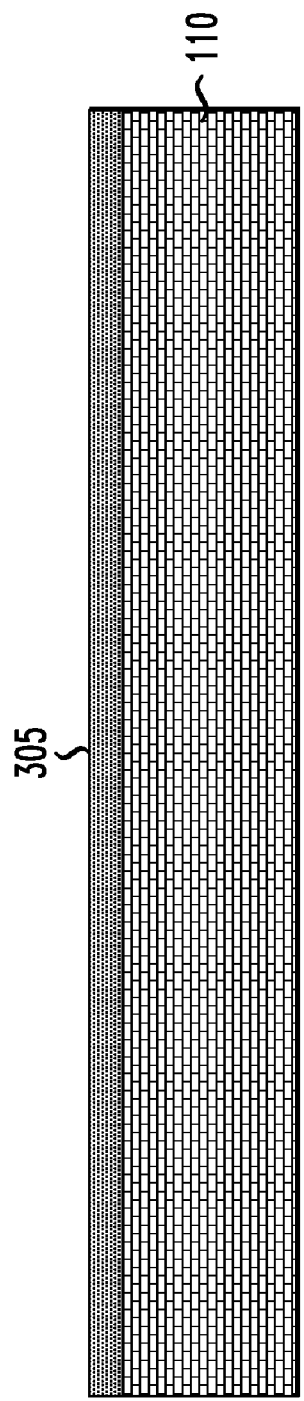
Figure 3B:
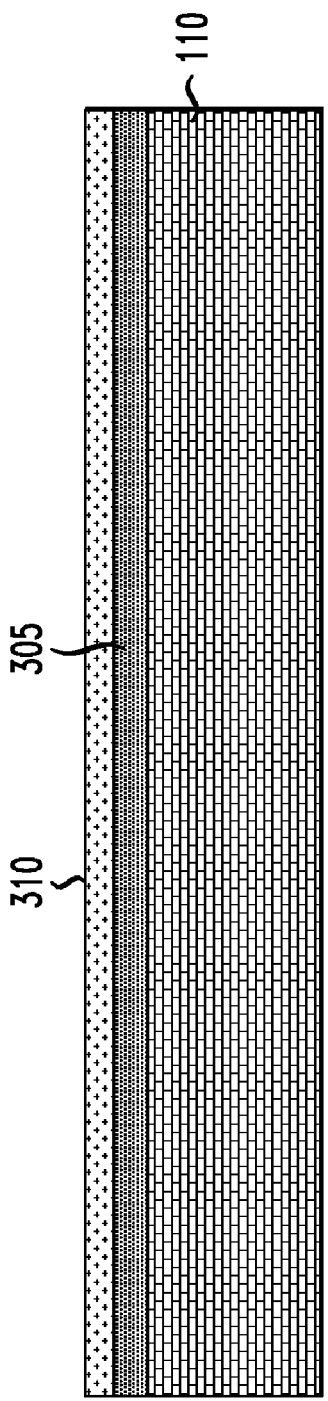
Figure 3C:
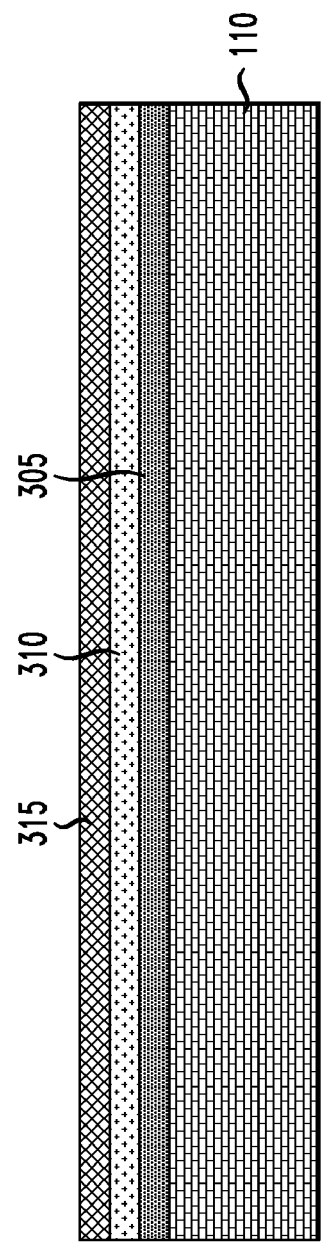

Subsequently, in step 210, a first layer 315 is deposited on the film stack, as shown in FIG. 3C. The first layer preferably comprises a combination of tantalum, silicon, and nitrogen such as TaSiN. TaSiN is frequently used in conventional semiconductor devices as a diffusion barrier for copper interconnects. It may be deposited by the physical vapor deposition (PVD) of a tantalum-silicon target in an argon-nitrogen ambient. Preferred compositions for the TaSiN in the present embodiment are about 20 atomic percent (at. %) to about 40 at. % tantalum, about 10 at. % to about 30 at. % silicon, and about 30 at. % to about 60 at. % nitrogen, although other compositions would still come within the scope of the invention.

Figure 3D:
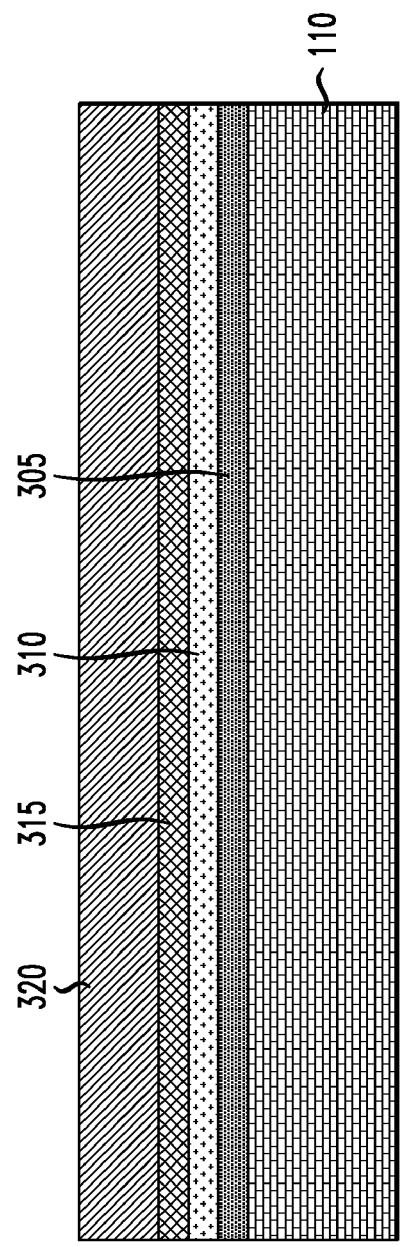

In step 215, a second layer 320 is deposited on the first layer 315, resulting in the film stack shown in FIG. 3D. The second layer preferably comprises a photoresist adapted for use with optical lithography. This photoresist may, for example, comprise UVN™ 30, a negative deep ultra-violet optical photoresist commercially available from Rohm and Haas of Philadelphia, Pa. USA (previously Shipley). This photoresist comprises 60-95% propylene glycol monomethyl ether acetate. It may be spun onto the film stack.

In step 220, the second layer 320 is patterned to form raised features 325 on the first layer 315. A sectional view of the resultant film stack is shown in FIG. 3E and a plan view is shown in FIG. 3F. In particular, FIG. 3E is a cross-sectional view along line E-E' in FIG. 3F. If the second layer comprises a photoresist, this step is preferably performed by lithography. For example, when using UVN 30 for the second layer, the exposure of the photoresist may be by conventional optical lithography. Development of the photoresist after exposure is also performed in a conventional manner. It may be performed, for example, by developing the photoresist in a commercially available developer solution such as Microposit™. MF-321 Developer, also from Rohm and Haas.

As will be described in greater detail below, the edges (i.e., sidewalls) of the raised features 325 will directly affect the ultimate positioning and shapes of the gate conductors 100. As a result, the raised features in the present embodiment are preferably positioned and shaped so that their edges correspond to the desired positions and shapes of the gate conductors.

In step 225, the first layer 315 is further processed such that components of the first layer deposit on the one or more sidewalls of the raised features 325. This sidewall deposition forms the mask features 330 shown in FIG. 3G. When using TaSiN for the first layer and UVN 30 for the second layer 320, for example, this step may be performed by anisotropically etching the film stack using reactive ion etching (RIE). The RIE preferably comprises halogen-containing reactants such as chlorine (e.g., $Cl_2$) or hydrogen bromide (e.g., HBr). The halogen-containing reactants may optionally be mixed with an inert gas such as argon and other additives such as those containing oxygen, nitrogen, carbon, or combinations thereof. The anisotropic etch process is preferably configured so that it does not etch, or only very slowly etches, the etch stop layer 310. This allows the anisotropic etch process to be performed until the exposed portions of the first layer are completely removed from the uppermost surface of the etch stop layer without etching through the etch stop layer and damaging those elements underlying it.

In step 230 the raised features 325 are removed, resulting in the film stack shown in FIG. 3H. If the raised features comprise a photoresist like UVN 30, this step may be performed by a conventional photoresist chemical stripping process that will be familiar to one skilled in the art. Subsequently, in step 235, the remaining portions of the first layer are removed while leaving the mask features intact, resulting in the film stack shown in FIG. 3I. If the first layer comprises TaSiN, this step may, for example, be accomplished by another RIE process. Removal of the TaSiN layer and formation of the structure is preferably accomplished by using a halogen-bearing reactant gas such as $Cl_2$, HBr, or the like, optionally mixed with inert gas such as argon (Ar) and/or other additives containing oxygen, nitrogen, carbon, or other species which may render the structure less reactive and therefore more stable during subsequent processing.

In step 240, the mask features 330 are used as an etch mask to pattern the layers to be patterned, namely the etch stop layer 310 and the layer of gate material 305. The etch preferably comprises an anisotropic etch process that does not etch or only very slowly etches the mask features. If the etch stop layer comprises silicon dioxide and the layer of gate material comprises polysilicon, such an anisotropic etch may, for example, comprise RIE. Such an etch process forms the film stack shown in FIG. 3J. One will observe that the gate conductors 100 have been defined. Small amounts of the etch stop layer 315 remain on top of each of the gate conductors.

In step 245, the mask features 330 are removed, as shown in FIG. 3K. If the first layer 315 comprises TaSiN and the second layer 320 comprises UVN 30, for example, this step may be performed by immersing the film stack in a solution of 100:1 diluted hydrofluoric acid.

The dielectric material 120 is then formed between the gate conductors. In step 250, the dielectric material is conformally deposited on the film stack by, for example, CVD, as shown in FIG. 3L. In step 255, this dielectric material is planarized down to the tops of the gate conductors by, for example, chemical mechanical planarization (CMP). The resultant film stack appears like that shown in FIGS. 1A and 1B.

Advantageously, methods in accordance with aspects of the invention allow the placement and physical characteristics of the resultant patterned features to be precisely controlled. As indicated above, the mask features 330 formed by the illustrative method form on the sidewalls of the raised features 325. In other words, the mask features are, in effect, "self-aligned" to the edges of raised features. As a result, patterned features with desired positions and shapes may be formed on the substrate by simply patterning the raised features so that their sidewalls describe these desired positions and shapes.

Moreover, the widths of the patterned features may also be adapted to a particular application. The widths of the patterned features are dependent on the widths of the mask features 330 formed on the sidewalls of the raised features 325. The widths of the mask features, in turn, depend on the extent to which the first layer 315 is processed in step 225. Thickening the first layer allows additional processing and, in turn, additional sidewall deposition and wider mask features.

As indicated earlier, methods in accordance with aspects of this invention are operable to form several different types of patterned features in an integrated circuit. Patterned metallic interconnects, for example, may be formed using a method similar to the method 200 in part by simply modifying the composition of the layers to be patterned. More specifically, the layer of gate material may be substituted by a layer of material appropriate for the metallic interconnects (e.g., aluminum, tungsten, or copper). These and the other modifications to the method 200 required to form these other patterned feature types will be apparent to one skilled in the art.

Mask features with heights of about 200 nanometers and sidewall thicknesses of less than about ten nanometers were readily formed with the method 200 using TaSiN as the first layer 315 and UVN 30 as the second layer 320. In addition, in separate trials, similar mask features were formed using a second layer comprising NEB-22, a photoresist adapted for use with electron beam lithography that comprises 1-methoxy-2-propanol acetate ($C_6H_{12}O_3$). In these trials, electron beam lithography was utilized to pattern the raised features in step 220. Notably, the mask features formed using NEB-22 were observed to remain intact even after immersion in 100:1 diluted hydrofluoric acid for more than three minutes. This result would seem to indicate that the choice of the second material has an effect on the physical characteristics of the mask features formed thereon. As result, if a photoresist like NEB-22 is utilized, it is preferable that a process like RIE or CMP be utilized to remove the mask features in step 245.

Methods in accordance with aspects of the invention may be utilized to form an integrated circuit. The integrated circuit design is created in a graphical computer programming language, and is stored in a computer storage medium (such as a disk, tape, physical hard drive, or virtual hard drive such as in a storage access network). If the designer does not fabricate integrated circuits or photolithographic masks used to fabricate integrated circuits, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the integrated circuit design in question that are formed on a wafer. The photolithographic masks are utilized to define areas of the wafer (and/or the layers thereon) to be etched or otherwise processed.

The resulting integrated circuits may be distributed by the fabricator in raw wafer form (i.e., as a single wafer that has multiple unpackaged integrated circuits), as a bare die, or in packaged form. In the latter case, the integrated circuit is mounted in a single integrated circuit package (e.g., plastic carrier with leads that are affixed to a motherboard or other higher level carrier) or in a multi-integrated circuit package (e.g., ceramic carrier that has either or both surface interconnections or buried interconnections). In any case, the integrated circuit is then integrated with other chips, discrete circuit elements, and/or other signal processing devices as part of either an intermediate product (e.g., motherboard) or an end product. The end product may be any product that includes integrated circuits, ranging from toys and other low-end applications to advanced computer products having a display, a keyboard or other input device, and a central processor.

Although illustrative embodiments of the present invention have been described herein with reference to the accompanying figures, it is to be understood that the invention is not limited to those precise embodiments, and that various other changes and modifications may be made to these embodiments by one skilled in the art without departing from the scope of the appended claims.

What is claimed is:

1. A method of forming a feature in an integrated circuit, the method comprising the steps of:
   providing one or more layers to be patterned;
   providing a first layer overlying the one or more layers to be patterned;
   providing a second layer overlying the first layer;
   patterning the second layer to form a raised feature with one or more sidewalls;
   processing the first layer such that components of the first layer deposit on the one or more sidewalls of the raised feature to form a mask; and
   utilizing the mask to pattern the one or more layers to be patterned.

2. The method of claim 1, further comprising the step of removing the raised feature.

3. The method of claim 1, further comprising the step of removing at least a portion of the first layer.

4. The method of claim 1, wherein the first layer comprises tantalum silicon nitride.

5. The method of claim 1, wherein the second layer comprises a photoresist.

6. The method of claim 5, wherein the photoresist is adapted for optical lithography.

7. The method of claim 5, wherein the photoresist is adapted for electron beam lithography.

8. The method of claim 1, wherein the step of patterning the second layer comprises optical lithography.

9. The method of claim 1, wherein the step of patterning the second layer comprises electron-beam lithography.

10. The method of claim 1, wherein the step of processing the first layer comprises etching the first layer.

11. The method of claim 10, wherein the etching comprises reactive ion etching.

12. The method of claim 11, wherein the reactive ion etching utilizes a halogen-containing reactant.

13. The method of claim 1, wherein the step of utilizing the mask to pattern the one or more layers to be patterned comprises anisotropic etching.

14. The method of claim 1, wherein the mask has a minimum dimension in a plane parallel to an uppermost surface of the first layer less than about ten nanometers.

15. The method of claim 1, wherein the feature comprises a gate conductor.

16. The method of claim 1, wherein the feature comprises a metal interconnect.

17. An integrated circuit, the integrated circuit formed by a method comprising the steps of:
   providing one or more layers to be patterned;
   providing a first layer overlying the one or more layers to be patterned;
   providing a second layer overlying the first layer;
   patterning the second layer to form a raised feature with one or more sidewalls;
   processing the first layer such that components of the first layer deposit on the one or more sidewalls of the raised feature to form a mask; and
   utilizing the mask to pattern the one or more layers to be patterned.

18. An apparatus comprising an integrated circuit, the integrated circuit formed using a method comprising the steps of:
   providing one or more layers to be patterned;
   providing a first layer overlying the one or more layers to be patterned;
   providing a second layer overlying the first layer;
   patterning the second layer to form a raised feature with one or more sidewalls;
   processing the first layer such that components of the first layer deposit on the one or more sidewalls of the raised feature to form a mask; and
   utilizing the mask to pattern the one or more layers to be patterned.

* * * * *